United States Patent [19]

Grimes

[11] Patent Number: 4,528,521
[45] Date of Patent: Jul. 9, 1985

[54] PRECISION CONTROL FREQUENCY SYNTHESIZER HAVING AN UNSTABLE, VARIABLE FREQUENCY INPUT SIGNAL

[75] Inventor: Gary J. Grimes, Thornton, Colo.

[73] Assignee: AT&T Information Systems Inc., Holmdel, N.J.

[21] Appl. No.: 578,697

[22] Filed: Feb. 9, 1984

[51] Int. Cl.³ .............................................. H03L 7/16
[52] U.S. Cl. ................................. 331/1 A; 331/16; 331/17; 331/25; 331/14
[58] Field of Search ...................... 331/1 A, 16, 17, 25, 331/14

[56] References Cited

U.S. PATENT DOCUMENTS

3,898,690 8/1975 Desai ............................... 331/17 X
4,453,136 6/1984 Kelland ............................. 331/1 A Primary Examiner—Siegfried H. Grimm
Attorney, Agent, or Firm—D. M. Duft

[57] ABSTRACT

The subject invention is a precision controlled frequency synthesizer which is capable of precisely adjusting the frequency of an output signal to maintain a desired frequency difference between an input and output signal regardless of the stability of the frequency of an input signal. The synthesizer comprises the basic elements of a phase locked loop (PLL) type circuit. The PLL circuit portion detects the actual frequency difference, a value A, between the input and output signals. A reference source provides a desired frequency difference, a value D, which represents the frequency difference between a stable input frequency and a desired output frequency. The difference between the frequency difference values A and D serves as the amount of adjustment to the frequency of the output signal. This adjustment represents the amount of compensation necessary to maintain a specified frequency relationship between the input and output signals.

17 Claims, 3 Drawing Figures

FIG. 1 PLL SYNTHESIZER (PRIOR ART)

$$f_{out} = \frac{N}{M} \times f_{in}$$

PRECISION CONTROL FREQUENCY SYNTHESIZER HAVING AN UNSTABLE, VARIABLE FREQUENCY INPUT SIGNAL

TECHNICAL FIELD OF THE INVENTION

This invention relates to frequency synthesizers and more particularly, to a frequency synthesizer capable of precisely controlling the frequency of an output signal to maintain a desired frequency relationship or difference between an input signal and the output signal regardless of the instability of the frequency of the input signal.

BACKGROUND OF THE INVENTION

Most synthesizers known to the art are of the conventional phase-locked loop (PLL) type. In the simplest configuration, the PLL synthesizer includes three basic elements:

(1) a voltage controlled oscillator
(2) a frequency and phase comparator
(3) a low pass filter.

The above elements operate together to change the frequency of an output signal to equal the frequency of an input signal. In particular, the frequency and phase comparator compares the relative phases of the input and output signals and generates a phase error signal when a phase difference between the two signals occurs. This phase difference indicates a frequency difference between the input and output signals. The phase error signal is filtered and stabilized by the low pass filter, and then applied to the voltage controlled oscillator. The voltage controlled oscillator generates, in response to the phase error signal, the output signal having a frequency change equal to the amount of the frequency difference. The output signal is then fed back via a loop to the frequency and phase comparator following the change in frequency of the output signal to determine that the input and output signals are now in phase and of equal frequencies.

If the output signal is equal in frequency to the input signal, no phase error signal is generated and the frequency difference is equal to 0. This condition indicates that the two signals are in phase and that the frequencies of the input and output signals are locked i.e., equal. However if the output signal is not equal in frequency to the input signal, a phase error signal is generated and the frequency difference is not equal to 0. This condition indicates that the two signals are out of phase and therefore, the frequencies of the two signals are not locked i.e., not equal. Under the later condition, the voltage controlled oscillator generates the output signal having a frequency change equal to the amount of the frequency difference. The frequency of the output signal either increases or decreases to preserve a locked condition, i.e., the input and output signal are in phase and of equal frequencies.

The inclusion of additional elements allows more sophisticated synthesizers to provide a proportional frequency relationship between the input and output signals. In this arrangement, the frequency of the input signal is divided by an integer M, and the generated output signal from the voltage controlled oscillator is divided by an integer N. The relative phases and frequencies of these two divided signals are then compared in the frequency and phase comparator to determine if the proportional frequency relationship exists. Phase locking imposes a condition that may be expressed as follows:

$$f_{out} = \left(\frac{N}{M}\right) f_{in} \quad (1)$$

where the frequency difference between the input and output signals is:

frequency difference = (2)

$$f_{out} - f_{in} = \left(\frac{N}{M}\right) f_{in} - f_{in} = \left(\frac{N}{M} - 1\right) f_{in}$$

This relationship indicates that the output frequency is locked to a rational fraction of the input frequency.

In any PLL-type of arrangement, any change or adjustment to the frequency of the output signal is a function of the frequency difference between the input and output signals. The amount of frequency difference bears a direct relationship to the frequency of the input signal as illustrated by the above equations. Under conditions where the input signal maintains a fixed frequency, i.e., the input signal is stable, a desired frequency difference is always maintainable. However under conditions where the input signal changes frequency, i.e., the input signal is not stable, a PLL-type of arrangement is of limited use. The adjustment to the frequency of the output signal is a function of the frequency difference between the input and output signals. The frequency difference changes with respect to any changes occurring in the frequency of the input signal. Therefore when a specified frequency relationship between an input and output signal is desired, an unstable input signal precludes the maintenance of a desired output frequency since the adjustment to the output frequency is a direct function of the frequency difference between the two signals.

It is, therefore, desirable to provide an arrangement that is capable of precisely adjusting the output signal so that the desired frequency relationship or difference exists regardless of the stability of the frequency of the input signal.

SUMMARY OF THE INVENTION

The disclosed synthesizer detects the actual frequency difference, a value A, between the frequencies of the input and output signals. A reference source provides a desired frequency difference, a value D, which represents the frequency difference between a stable input frequency and a desired output frequency. The difference between the values A and D serves as the adjustment value to the frequency of the output signal. This adjustment value represents the amount of compensation necessary for maintaining a desired frequency difference where the frequency of the input signal varies and affects the actual frequency difference between the input and output signals.

In particular, the subject synthesizer comprises the basic elements of a PLL circuit—a frequency and phase comparator, a low pass filter and a voltage controlled oscillator. These elements operate as in the PLL arrangement previously described. The frequency and phase comparator compares the relative phases of the input and output signals. When the two signals change their phase relationship indicating a change in frequency, the frequency and phase comparator generates a phase error signal representing an actual frequency difference. This frequency difference equals an actual value A that serves as a partial adjustment value to the frequency of the output signal.

Additional adjustment information is derived from a reference source. A user specifies from a control panel the desired frequency difference that should occur under conditions where the frequency of the actual input signal is stable and the desired frequency of the output signal is maintainable. This frequency difference equals a desired value D.

The actual value A and the desired value D are applied to a subtraction element, termed a digital signed difference element. The digital signed difference element performs arithmetic operations to determine if the actual and desired values (A-D) associated with the frequency differences are identical. When there is no difference between the two values, i.e., the actual and desired values (A and D) are equal, the difference element generates no adjustment signal and the frequency of the output signal remains unchanged. This indicates that the desired frequency difference between in the input and output signals exists. However when there is a difference between the actual and desired values (A-D), the difference element generates an adjustment signal. This difference indicates that the frequency of the input signal changed and directly affects the actual frequency difference between the input and output signals. In response to this detected difference between the value A and the value D, the synthesizer performs adjustment operations. The generated adjustment signal represents the amount of compensation necessary to adjust the frequency of the output signal, which is generated by the voltage controlled oscillator, to the desired output frequency such that the specified frequency difference now exists. This synthesizer precisely controls the frequency adjustment to the output signal to maintain the desired frequency difference and compensates for the instability of the frequency of the input signal.

BRIEF DESCRIPTION OF THE DRAWINGS

This invention may be better understood by reading the following detailed description with reference to the accompanying drawings wherein.

DETAILED DESCRIPTION

Figure 1:
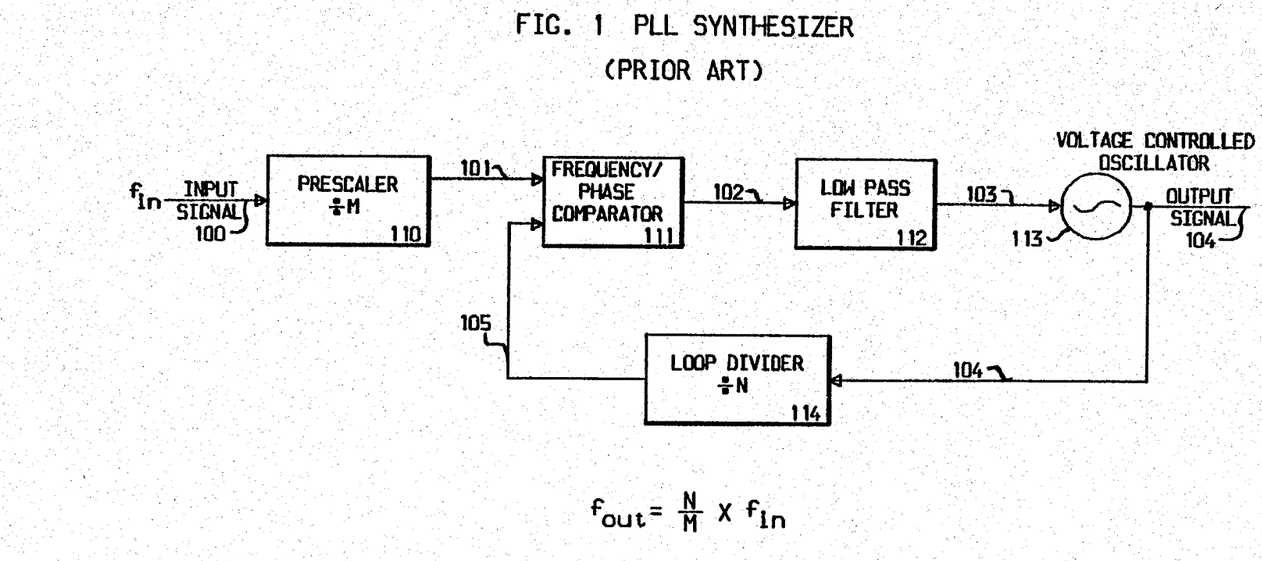
FIG. 1 illustrates a typical prior art PLL synthesizer circuit arrangement.

FIG. 1 illustrates a block diagram of a typical prior art PLL frequency synthesizer. The synthesizer comprises prescaler 110, frequency and phase comparator 111, low pass filter 112, voltage controlled oscillator 113 and divider 114. Variations in the circuit arrangement disclosed and the inclusion of additional elements to achieve different proportional relationships between the input and output signals are possible for adaptation to various applications. For examples, see the books entitled *Frequency Synthesis* by V. F. Kroupa published by Halsted Press of John Wiley and Sons, Inc., 1973, *Phaselock Techniques*, 2nd edition by F. M. Garnder published by Wiley Interscience of John Wiley and Sons, Inc., 1979, pp. 208-214 and *Digital PLL Frequency Synthesizers, Theory and Design* by V. L. Rohde published by Prentice-Hall, Inc., 1983. However for ease of description, a simple version of a frequency synthesizer is shown on FIG. 1.

The basic principle of all PLL-type synthesizers is that the output frequency, $f_{out}$, is normalized with respect to the input frequency, $f_{in}$. Mathematically, the relationship between the input and output signals is expressed as follows:

$$f_{out} = \left(\frac{N}{M}\right) f_{in} \qquad (3)$$

where the frequency difference between the signals is:

$$f = f_{out} - f_{in} = \left(\frac{N}{M}\right) f_{in} - f_{in} = \left(\frac{N}{M} - 1\right) f_{in} \qquad (4)$$

A rigorous mathematical analysis of the PLL arrangement is quite cumbersome and is, therefore, not repeated here. A more complete mathematical analysis may be found in any of the above-mentioned books and in particular, *Frequency Synthesis*, Chapter 7, pages 199-237. However, the thrust of the equation is to indicate that the frequency of the output signal bears a direct relationship to the frequency of the input signal.

Prescaler 110 receives an input signal over lead 100. Prescaler 110 divides the input signal by a value M and applies this divided signal to frequency and phase comparator 111. Frequency and phase comparator 111 also receives an output signal divided by a value N over path 105 as extended through the loop divider 114 from path 104. The N/M factor determines the proportional relationship between the input and output signals when such a relationship is desired. Comparator 111 compares the relative phases of these two divided signals and generates a phase error signal on path 102 indicative of a frequency difference between the divided input and output signals. This phase error signal is stabilized by low pass filter 112 and is applied over path 103 to oscillator 113. Oscillator 113 is of the voltage controlled type that generates the corrected output signal in response to the phase error signal. The output signal changes frequency by the amount of the frequency difference to maintain the proportional frequency difference between the input and output signals and locks the two signals into that frequency relationship.

The adjustment to the output signal to maintain the proportional frequency relationship between the input and output signals is a direct function of the actual frequency difference between the input signal and output signals. For example, if the input signal changes to a lower frequency, the proportional relationship N/M as set by the prescaler and divider is still maintained, but the output frequency is changed, i.e., lowered. Such a change in the frequency of the input and output signals alters the frequency difference between the input and output signals. This result is illustrated in the above equations. The actual frequency difference is a direct function of the actual frequency of the input signal. Therefore the instability of the frequency of the input signal directly affects the frequency difference so that the desired output frequency is not maintainable with respect to a specified frequency relationship.

Precision Control Frequency Synthesizer

Figure 2:
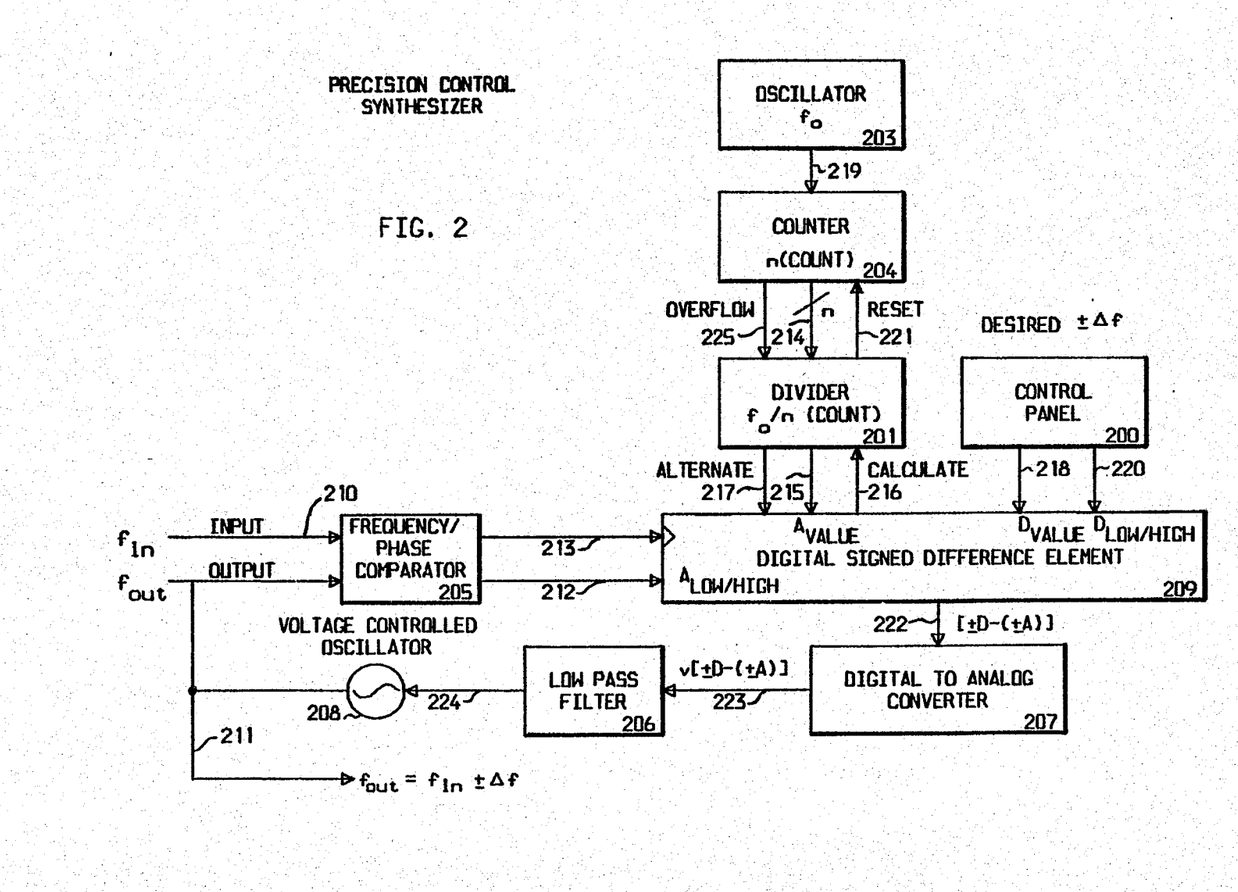
FIG. 2 illustrates the circuit arrangement of the precision control frequency synthesizer.

FIG. 2 discloses the elements of the precision control frequency synthesizer. This synthesizer eliminates the dependence of the output frequency as a function of the actual frequency of the input signal. A desired output frequency is, therefore, maintainable under conditions where the input signal changes frequency and directly affects the actual frequency difference between the input and output signals.

The synthesizer of FIG. 2 comprises the basic elements of a PLL synthesizer circuit. These elements include a frequency and phase comparator 205, a low pass filter 206, a digital to analog converter (DAC) 207, and a voltage controlled oscillator 208. As previously described in connection with the PLL arrangement, comparator 205 generates a phase error signal indicative of a frequency difference between the input signal on lead 210 and the output signal on lead 211. Comparator 205 applies this phase error or frequency difference indication signal over lead 213, through the digital signed difference element 209 (discussed subsequently), to DAC 207 which converts a digital representation of the frequency difference to an analog signal. DAC 207 applies this signal on lead 223 to low pass filter 206. Low pass filter 206 stabilizes the analog signal and applies it over path 224 to voltage controlled oscillator 208. Voltage controlled oscillator 208 generates an adjusted output signal on lead 211. The output signal feeds back to comparator 205. Comparator 205 then compares the input signal on lead 210 with the adjusted output signal on lead 211 and generates an indication of an actual frequency difference between these two signals.

Frequency and Phase Comparator 205

The elements described above operate as previously described in the PLL arrangement of FIG. 1. However, in the FIG. 2 arrangement, the frequency and phase comparator (205) produces a frequency difference indication directly rather than a phase error signal indicative of a frequency difference. This type of frequency and phase comparator is of the type described in the above cited book *Digital PLL Frequency Synthesizers*, pp. 205-234, and in U.S. Pat. No. 4,264,866 issued on Apr. 28, 1981 to L. Benes. Additionally, an applicable comparator has been disclosed in another application, identified as Ser. No. 526,642, filed Aug. 26, 1983, and assigned to the assignee of the present invention. The comparator disclosed in this application detects minor frequency changes between two signals and provides frequency difference indications with each occurrence of a frequency change. Most of the comparators cited respond only to gross rather than minor frequency changes between two signals and therefore inconsistently regulate the output frequency. Additionally, the comparator cited in the above-mentioned application is capable of maintaining equal frequencies or a proportional frequency relationship between an input and an output signal. The operation of the comparator is identical whether or not there is a proportional relationship.

Frequency and phase comparator 205 receives the input signal on path 210 and the output signal on path 211. Both signals have identical waveform patterns. This comparator monitors these two signals and compares their relative phases. The phase relationship indicates whether there is a change in the frequency relationship between these two signals. For example, when both signals are in phase and of exact frequencies, frequency and phase comparator 205 generates a signal indicative of this condition on path 213. When the frequencies of the two signals are not equal, the signals are out of phase with respect to one another. Comparator 205 responds to each change in frequency between the input and output signals and generates two signals with each occurrence of a frequency change. The signal on path 213 indicates that a change in frequency, i.e., a frequency difference between the two signals occurred. The signal on path 212 indicates whether the output signal is of a higher or lower frequency than the input signal. In particular, comparator 205 generates a series of pulses per unit time over path 213. The number of pulses generated per unit time indicates the amount of frequency difference between the input and output signals. For example, 10 pulses generated over a 1 second period indicates a frequency difference equal to 10 Hz, and 20 pulses generated over a 1 second period indicates a frequency difference equal to 20 Hz. Each generated pulse on lead 213 acts as a clock signal which activates digital signed difference element 209 (discussed subsequently) to determine a frequency difference.

Actual Frequency Difference Value Determination

The frequency difference between the input signal on lead 210 and the output signal on lead 211 is determined by oscillator 203, counter 204 and divider 201 in response to each pulse received over lead 213 from frequency and phase comparator 205. As previously explained, comparator 205 generates a series of pulses in response to a frequency difference that occurs between the two signals. The number of pulses generated per unit time indicates whether the frequency difference is large or small in magnitude. For example, the larger the difference, the more frequent the occurrence of the generated pulses. The digital signed difference element 209 responds to each pulse generated over lead 213 by comparator 205.

Oscillator 203 oscillates and generates a series of pulses of a preset frequency. The preset frequency of oscillator 203 is higher in frequency than expected of a frequency difference between the input and output signals. The frequency of oscillator 203 is determined prior to circuit design. A designer determines the maximum desired frequency difference that may occur between the input and output signals and chooses an oscillator having a frequency higher than the highest expected frequency difference. For example, if the designer determines the highest expected frequency difference to be only 1000 Hz, the designer may choose a 1 MHz oscillator. Therefore, when the input frequency changes with respect to the output frequency, the circuit detects the frequency difference. This design choice ensures a more precise adjustment scheme, since the sensitivity of the circuit is increased as oscillator 203 increases its frequency range. Oscillator 203 provides a constant output of pulses over lead 219 to counter 204.

Counter 204 increments in response to each pulse received over lead 219. Counter 204 is an up-type counter having a finite count. The maximum count possible by counter 204 is determined by the designer. The maximum count equals the number of pulses associated with the largest possible frequency difference that may, but probably would not, occur between the input and output signals. Again the designer includes a large safety margin in order to provide corrective measures under most conditions where a frequency difference occurs. Counter 204 applies count pulses over lead 214 to divider 201.

Divider 201 is a standard microprocessor which performs calculations to determine an actual frequency difference between the input signal on lead 210 and the output signal on lead 211. Divider 201 responds to a calculate signal received over lead 216 from digital signed difference element 209. In particular, as previously described, comparator 205 generates a series of pulses in response to each frequency change between the input and output signals. Each pulse received over lead 213 from comparator 205 acts as a clock signal. Digital signed difference element 209 (discussed subsequently) receives this clock signal over lead 213 and generates a calculate signal over path 216. The calculate signal on lead 216 interrupts the count pulses received over lead 214 from counter 204. Assume counter 204 has not reached its maximum count, but began at 0 count prior to divider 201 receiving the calculate signal over path 216. Since the calculate signal over lead 216 acts to interrupt the count pulses received on path 214; immediately following the interrupt, a numerical sum of the count of counter 204 results. The sum varies depending on the time interval between pulses received over path 213 from comparator 205. Divider 201 stores this sum, and concurrently retrieves from memory (not shown) the frequency value of oscillator 203 which is preprogrammed into divider 201. Following retrieval, divider 201 divides the oscillator 203 frequency by the sum to determine the frequency difference between the input and output signals. The result of this calculation is applied as a signal over lead 215 to digital signed difference element 209 (discussed subsequently). The signal is a digital representation of the actual frequency difference or $A_{value}$ between the input and output signals.

Following the calculation, divider 201 generates a reset signal over path 221 to counter 204. Counter 204 starts counting at 0 again in response to the reset signal. Counter 204 is not reset until divider 201 performs the appropriate calculation and applies the actual value of the frequency difference over lead 215 to digital signed difference element 209 (discussed subsequently). Therefore in response to each pulse received over path 213 from comparator 205, an actual frequency difference value, $A_{value}$, is calculated by divider 201.

Under conditions where no calculate signal is applied over path 216 from digital signed difference element 209, counter 204 reaches its maximum count. Counter 204 then applies an overflow signal over path 225 to divider 201. Divider 201 additionally receives on path 214 a sum representing the maximum count from counter 204. Divider 201, in response to the overflow signal on path 225 generates an alternate calculate signal over path 217 to digital signed difference element 209 (discussed subsequently). Digital signed difference element 209 in response to the alternate calculate signal received over path 217 applies a calculate signal over lead 216 to divider 201. Divider 201 retrieves from memory (not shown) the maximum sum and the frequency value of oscillator 203, and performs the appropriate mathematical computation in response to the calculate signal previously discussed. Following the calculation, divider 201 generates a reset signal over path 221 to counter 204 to start a new count.

Divider 201 generates the frequency difference value, $A_{value}$, as a signal over path 215 to digital signed difference element 209 following the arithmetic computation. This value is not the actual value of the frequency difference between the input and output signals under this condition, but still serves as partial adjustment to the output frequency if necessary. A value derived from the maximum count of counter 204 indicates that the frequency difference between the two signals is relatively small since the division performed by divider 201 produces a relatively small value which represents a relatively small frequency difference between the input and output signals. The details of the operation of the digital signed difference element 209 are discussed subsequently.

As previously described, comparator 205 also generates a low/high indication signal ($A_{low/high}$) and applies this signal over lead 212 to digital signed difference element 209 which stores this indication. This indication characterizes the $A_{value}$ as either positive or negative depending on whether the output frequency is either higher (+) or lower (−) than the input frequency.

Digital signed difference element 209 contains the $A_{value}$ indicative of the actual frequency difference between the input and output signals and an associated − or +, $A_{low/high}$, indication representing whether the output signal is lower or higher in frequency than the input signal. However, the $A_{value}$ varies with the frequency of the input signal and therefore, an adjustment to the output frequency with respect to this frequency difference would preclude a desired output frequency. This adjustment only compensates for the frequency difference and does not reflect the change in the input frequency. An additional compensation factor is, therefore, needed to provide an accurate and precise frequency adjustment to the output signal so that a specified frequency relationship between the the input and output signals is maintained. A controllable reference source provides the additional compensation factor necessary to overcome the instability of the frequency of the input signal.

Reference Source for Specifying a Desired Frequency Difference Value

FIG. 2 shows the controllable reference source as control panel 200. A user selects a frequency difference value and an associated negative or positive indication on panel 200. This value represents a desired frequency difference that should occur between the input and output signals under conditions where the input frequency is fixed and the output signal maintains a desired frequency.

The desired frequency difference value, $D_{value}$, is applied as a digital representation over lead 218 from control panel 200 to digital signed difference element 209 (discussed subsequently). Control panel 200 applies the associated negative or positive indication, $D_{low/high}$, over path 220 to digital signed difference element 209. The value indications, $D_{value}$ and $D_{low/high}$, represent the desired frequency relationship between a fixed frequency input signal and a desired frequency output signal which result under conditions where the frequency of the input signal remains stable at all times. This information remains constant until the user readjusts control panel 200.

In summary, digital signed difference element 209 receives two frequency values. A reference source (element 200) provides the desired frequency difference value ($D_{value}$) and its associated low/high indication ($D_{low/high}$). Divider 201 provides the actual frequency difference value ($A_{value}$) and frequency and phase comparator 205 provides its associated low/high indication ($A_{low/high}$). If the input signal maintains a fixed frequency so that the output signal maintains the desired frequency, the frequency difference values, i.e., $A_{value}$, $A_{low/high}$ and $D_{value}$, $D_{low/high}$ are always equal. However, under conditions where the input signal deviates from the fixed frequency, the frequency difference values are not equal. It is under the later condition that the digital signed difference element 209 performs a specified arithmetic operation.

Digital Signed Difference Element 209: Arithmetic Operations

Difference element 209 performs an arithmetic operation in response to the receipt of the actual and desired values and their associated low,/high indications. Divider 201, comparator 205 and control panel 200 provide these values as previously discussed. Difference element 209 subtracts the actual and desired values. If the difference between the two values equals 0, difference element 209 does not calculate an adjustment value. This indicates that the desired output frequency with respect to the specified frequency difference between the input and output signals is being presently maintained. However if the difference does not equal 0, the actual and desired frequency difference values are unequal. This indicates that the frequency of the input signal changed and affected the value of the frequency difference between the input and output signals. (This may also indicate that the output signal changed frequency. However, only the former case is disussed since the additional compensation factor operates to correct the output frequency in the same manner regardless of which signal or whether both signals changed frequency.) Difference element 209, in response to this difference, generates an adjustment value indicative of the amount of total compensation necessary to produce the desired output frequency following a change in the frequency of the input signal so that the specified frequency relationship between the input and output signals is maintained.

Digital signed difference element 209 generates an adjustment signal indicative of the adjustment value and applies the adjustment signal over path 222 to DAC 207. DAC 207 may be any standard digital to analog converter such as those obtainable from Analog Devices and Precision Monolithics, Inc. DAC 207 converts the adjustment signal, which is the digital representation of the adjustment value to an analog signal. DAC 207 then extends this analog signal over path 223 to low pass filter 206 which removes any transient noise and stabilizes the low frequency in the signal. Low pass filter 206 also adds a gain factor to maintain the proper control voltage for voltage controlled oscillator 208 and applies this filtered signal over path 224 to voltage controlled oscillator 208. Voltage controlled oscillator 208 generates the adjusted output signal over path 211. Following the adjustment to the frequency of the output signal, frequency and phase comparator 205 produces an actual frequency difference equal to the desired frequency difference. This indicates that the desired output frequency with respect to a specified frequency difference between the input and output signals is now present.

In addition, voltage controlled oscillator 208 also applies the output signal on path 211 to some peripheral device (not shown). Thereafter, an operator may adjust control panel 200 to alter that result if the user so desires.

Numerical Examples of Frequency Difference Calculations

The following examples are illustrative of the mathematical calculations that compensate for a variable input frequency. Under steady-state conditions, the frequencies of the input signal and output signal remain stable, and a specified proportional frequency relationship exists. Assume the input frequency is 10 kHz, the output frequency is 10.5 kHz and the desired frequency difference is +500 Hz as set from control panel 200. Assume further, oscillator 203 is set to 10 MHz and counter 204 has a maximum count of 10,000,000. Frequency and phase comparator 205 generates a series of pulses per unit time representative of the frequency difference between the input and output signals, which in this case is 500 Hz, i.e., 10.5 kHz–10 kHz. As previously described, each generated pulse over lead 213 acts as a clock signal to activate a calculate signal on lead 216 which interrupts the count from counter 204 to produce a sum. The sum represents the total amount of counts that counter 204 reached between resets and, in particular, the count resulting between each pulse received from comparator 205. Divider 201 responds to the calculate signal and performs the specified calculation of oscillator 203 frequency divided by the sum, which under steady-state conditions is 10 MHz/20,000. The result of the calculation equals 500 Hz. Divider 201 generates a signal over lead 215 representing the 500 Hz which indicates the actual frequency difference, $A_{value}$, between the input and output signals. In addition, comparator 205 generates a high or positive, $A_{low/high}$, signal over lead 212 to indicate that the output frequency is higher than the input frequency. The actual frequency difference is +500 Hz. Digital signed difference element 209 receives the desired and the actual frequency difference values, i.e., +500 Hz and +500 Hz. Difference element 209 subtracts the desired frequency difference (500) from the actual frequency difference (500) and produces a 0 adjustment value. Since the adjustment value equals 0, difference element 209 does not generate an adjustment signal. The above describes a steady state condition where the desired output frequency is maintained and the input frequency remains stable so that a desired frequency difference between the input and output signals exists.

The synthesizer of FIG. 2 maintains a desired frequency difference under conditions where the output frequency varies and changes the desired frequency relationship between a stable input signal and a variable output signal. This synthesizer either adjusts the frequency of the output signal up or down so that the desired frequency difference between the two signals is maintained where the input signal remains stable. However, when the input signal varies in frequency and affects the specified frequency difference between the input and output signals, the synthesizer also compensates for the instability of the incoming signal to maintain the specified frequency relationship between the two signals.

Assume that the input frequency changes to 10.1 kHz and the output frequency remains at 10.5 kHz. Under these conditions, divider 201 and comparator 205 generate a +400 Hz frequency difference value. The desired frequency difference remains at +500 Hz. Difference element 209 calculates a +100 Hz adjustment value. The output frequency is then adjusted up by 100 Hz to 10.6 kHz. This adjustment provides the 500 Hz specified frequency difference desired between the input and output signals. The 100 Hz adjustment value compensates for the change in frequency of the input signal so that the desired frequency difference of 500 Hz is maintained between the input and output signals. Conversely, if the input frequency changes to a 9.9 kHz, the output frequency changes to 10.4 kHz, thus maintaining the desired frequency difference of 500 Hz. Difference element 209 adjusts the output frequency to a desired output frequency so that the specified frequency relationship between the two signals is maintained despite the instability of the input signal.

Under conditions where the desired frequency difference is 0, the synthesizer performs operations that adjust the output frequency so that the actual frequency difference equals the desired frequency difference of 0. An actual frequency difference of 0 is theoretically maintainable, but may be practically limited by the precision of the elements used in the design of this synthesizer. However, for practical operation purposes, a frequency difference may be obtained that is so close to 0 that any frequency difference between the input and output signal is negligible.

Digital Signed Difference Element 209: Circuit Arrangement

Figure 3:
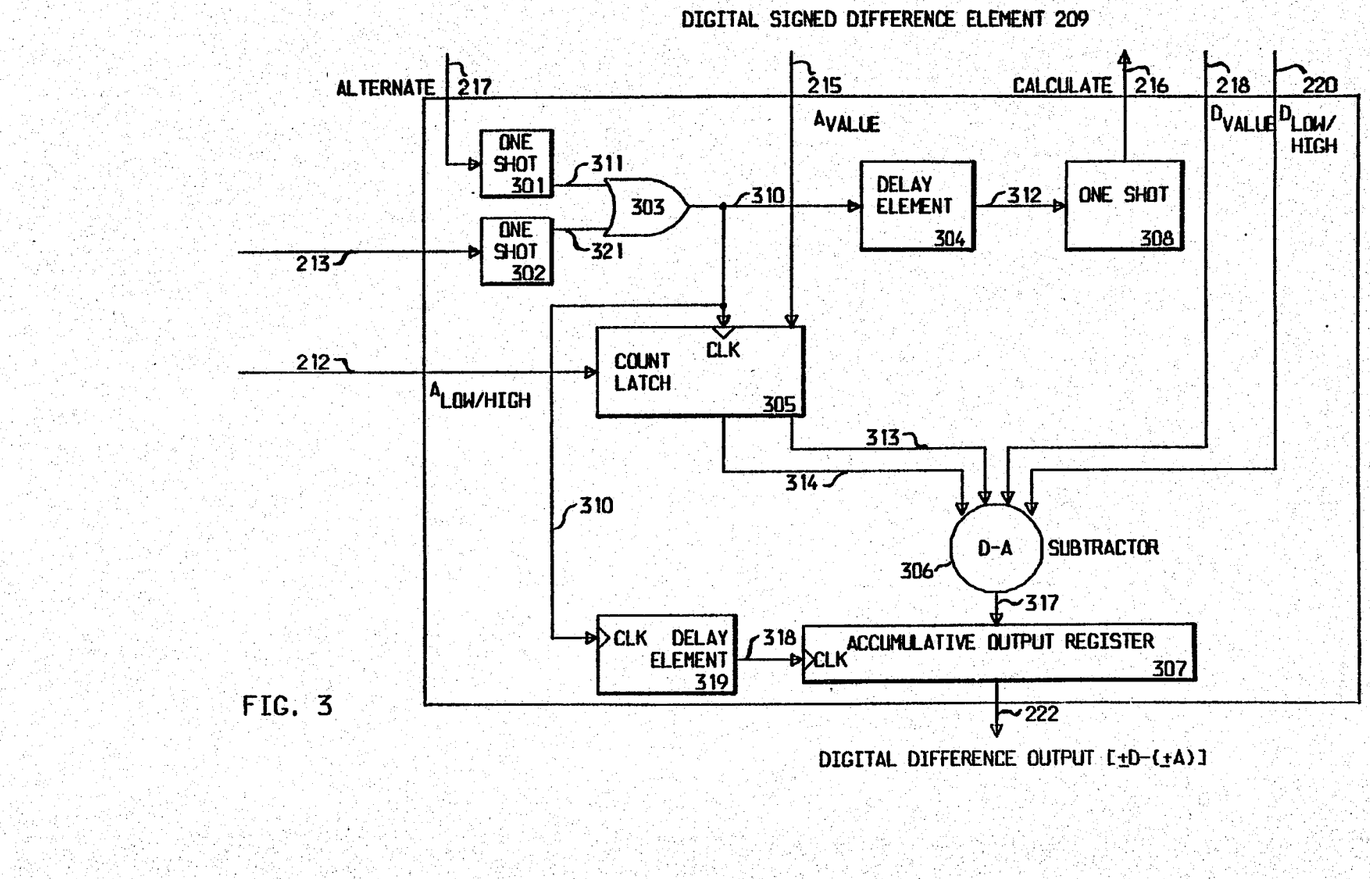
FIG. 3 illustrates the details of the digital signed difference element of FIG. 2.

FIG. 3 shows the digital signed difference element 209. Difference element 209 receives the desired value ($D_{value}$) of the frequency difference over path 218 and the associated low/high indication ($D_{low/high}$) over path 220. These signals are applied directly to subtractor 306.

Difference element 209 also receives from frequency and phase comparator 205, signals on path 213 and 212. The signal on path 213, as previously discussed, acts as a clock signal which latches the frequency difference value received from divider 201 over path 215 to indicate the actual frequency difference ($A_{value}$) between the input and output signals. The signal on path 212 is the associated low/high indication ($A_{low/high}$). The signals on path 212 and 215 are applied directly to count latch 305. The pulse on path 213 is applied to one-shot 302.

Divider 201 applies a frequency difference value over path 215 to count latch 305. One shot 302 receives a series of pulses per unit time on path 213 corresponding to the frequency difference between the input and output signals. In response to each pulse received on path 213, one-shot 302 momentarily changes from a reset to a set state and applies a high signal over path 321 to OR gate 303. Assume that divider 201 has not yet calculated the frequency difference, and therefore counter 204 is still incrementing. Assume further that there is no overflow signal from counter 204 to indicate that maximum count is reached, and that divider 201 is still receiving count pulses over path 214. Under these conditions, divider 201 does not generate an alternate calculate signal over path 217. Therefore, divider 201 applies a low signal over path 217 to one-shot 301. One-shot 301 does not change state in response to this low signal and a low signal is received by OR gate 303 over path 311. The combination of the high signal on path 321 and the low signal on path 311 to OR gate 303 produce a high signal on path 310 for the duration of the one-shot 302 time constant.

OR gate 303 applies this high signal over path 310 to delay element 304. Delay element 304 delays the application of this high signal over path 312 to one-shot 308. One-shot 308 responds to the receipt of the high signal and generates a calculate signal over path 216 to divider 201. Divider 201 then calculates the appropriate frequency difference value and applies this value as a signal over path 215 to count latch 305 where this value is latched in response to the high signal on path 310. The value on path 215 from divider 201 that is latched represents the value of the actual frequency difference ($A_{value}$) between the input and output signals. Following the calculation, divider 201 generates a reset signal over path 221 to counter 204 in order to start a new count at 0. The circuit design allows enough time for the frequency difference value to latch in count latch 305 before a new count begins in counter 204 to determine the following frequency difference.

As previously described, count latch 305 also receives an associated low/high indication ($A_{low/high}$) over path 212. Count latch 305 concurrently latches the $A_{low/high}$ indication received on path 212 and the $A_{value}$ received on path 215 in response to the momentary high signal on path 310.

Count latch 305 now contains the actual frequency difference and the appropriate negative or positive indication associated with that frequency difference. Following the latching operation in response to the high signal on path 310, count latch 305 applies the actual value of the frequency difference as a signal on path 313 and the associated low/high indication as a signal on path 314 to subtractor 306. Subtractor 306 now contains the actual ($A_{value}$) and desired ($D_{value}$) values of the frequency difference and the associated ($A_{low/high}$ and $D_{low/high}$, respectively) low/high indications.

Subtractor 306 is an arithmetic logic unit (ALU) which performs arithmetic operations in response to the above-described values. The operation of an ALU is known to the art and therefore a detailed explanation is not necessary. Subtractor 306 performs the subtraction operation between the desired value of the frequency difference having a low or high indication and the actual value of the frequency difference having a low or high indication ($D_{low/high}$, $D_{value} - A_{low/high}$, $A_{value}$). This arithmetic operation determines if the desired frequency difference between the input and output signals exists and consequently, if the output signal is maintaining a desired output frequency. At the conclusion of the arithmetic operation, subtractor 306 generates a signal over path 317 representative of the difference, if any, between the desired and actual values to accumulative output register 307.

Register 307 stores the difference which serves as an adjustment value. The adjustment value is stored until delay element 319 applies a clock signal over path 318 to register 307. Delay element 319 delays the application of the high signal on path 310 from gate 303 to path 318 to register 307 for the duration of the one-shot time constant. Delay element 319, operates in the same manner and for the same reasons as described with respect to delay element 304. A delay in the application of signals prevents the output of erroneous data from digital signed difference element 209 and, in particular, register 307 which then allows enough time for the subtraction operation of subtractor 306 to occur.

In response to the clock signal on path 318 following the prescribed time-constant delay, register 307 applies the adjustment value as an adjustment signal over path 222 to DAC 207. This adjustment signal as extended to voltage controlled oscillator 208 indicates the amount of compensation necessary to adjust the frequency of the output signal on path 211 so that a desired output frequency is maintained with respect to a specified frequency relationship between the input and output signals. An adjustment signal is generated only under conditions where a difference between the actual and desired value is not equal to 0 which indicates that the frequency of the input signal has changed.

Under conditions where no calculate signal appears on lead 216 in response to a pulse received over lead 213 and counter 204 has reached its maximum count, an alternate calculate signal, as previously described, is generated by difference element 209. In particular, counter 204 has a maximum count output of a count n. When n is reached, counter 204 generates an overflow signal over lead 225 to divider 201. Divider 201, in response to the overflow signal on lead 225, generates an alternate calculate signal on lead 217 to difference element 209. Divider 201 generates a high signal over path 217 to one-shot 301. In response to this high signal, one-shot 301 changes momentarily from a reset to a set state and generates a high signal on path 311. One-shot 301 applies this momentary high signal over path 311 to OR gate 303 for the duration of the one-shot time-constant. Since no frequency change is detected by frequency and phase comparator 205 to generate a calculate signal over lead 216 to divider 201, comparator 205 applies a low signal on path 213 to one-shot 302 which remains reset. One-shot 302 applies a low signal over path 321 to OR gate 303. The combination of a momentary high signal on path 311 and a low signal on path 321 allows OR gate 303 to apply a momentary high signal to delay elements 304 and 314, respectively. Delay elements 304 and 319 delay the application of the high signal to elements 308 and 307, respectively.

As previously explained, the purpose of the delay elements 304 and 319 is to prevent erroneous data output and to allow sufficient time for the actual frequency difference calculation to occur. Delay element 304 extends the delayed high signal from lead 310 to lead 216. Divider 201 responds to the high signal on lead 216 and divides the appropriate values, i.e., oscillator 203 frequency/maximun count n. Divider 201 applies a frequency difference signal over path 215 to count latch 305 following the calculation. Under the present example, count latch 305 latches the sum associated with the smallest frequency difference possible within the range of the synthesizer and its associated low/high frequency indication. This frequency difference ($A_{value}$) may not, however, be an accurate representation of the frequency difference between the input and output signals since the actual frequency difference may be smaller. Count latch 305 applies these signals over leads 313 and 314, respectively, to subtractor 306 which determines the difference to be an adjustment value of n. Subtractor 306 applies a signal over path 317 indicative of this difference to register 307. Register 307 stores the signal received on path 317 until delay element 319 extends the delayed high signal from lead 310 to lead 318 which then causes register 307 to generate the adjustment value as a signal on lead 222. The adjustment signal on lead 222 adjusts the output frequency by an extremely small or negligible amount. With this adjustment, the frequency difference should come within the range of the desired frequency difference. If not, several adjustments in this range will be made until the synthesizer adjusts to the desired frequency difference range, i.e., the actual frequency difference equals the desired frequency difference and therefore no adjustment to the output signal is necessary.

The described arrangement provides a method to maintain a desired frequency difference between an input and output signal independent of the stability of the frequency of the input signal. In particular, the circuits of FIGS. 2 and 3 disclose a compensation element, i.e., the digital signed difference element 209, that receives two values, one value indicative of the actual value of the frequency difference between an input and output signal and one value indicative of the desired value of the frequency difference between a fixed input and a desired output signal. When these values differ, an adjustment value is determined and an adjusted output signal is generated so that a specified frequency relationship is maintained between the input and output signals. The adjustment to the output frequency is not a direct function of the frequency difference between the input and output signals but includes an additional compensation factor that takes into account any frequency change in the input signal. This additional compensation factor assures a more accurate and precise adjustment to the output frequency regardless of the stability of the frequency of the input signal when a specified frequency relationship between the input and output signal is desired.

What is claimed is:

1. A precision controlled frequency synthesizer for maintaining a desired frequency difference between an input and an output signal comprising:
   comparator means (205, 203, 204, 201) responsive to the receipt of said input and said output signals for generating an actual value signal representative of the actual frequency difference between said input and output signals;
   referencing means (200) for generating a desired value signal representative of a desired frequency difference;
   computation means (209) responsive to a receipt of said actual value signal and said desired value signal to said computation means for producing an adjustment signal indicative of the difference between said actual frequency difference and said desired frequency difference; and
   control means (207, 206, 208) responsive to a receipt of said adjustment signal to said control means for changing the frequency of said output signal to maintain said desired frequency difference between said input and output signals.

2. The precision controlled frequency synthesizer of claim 1 wherein said comparator means (205, 203, 204, 201) comprises:
   detecting means (205) being operable for generating a first signal indicative of a magnitude of said actual frequency difference between said input and output signals;
   said detecting means (205) also being operable for generating a second signal associated with said first signal for indicating by a + or − whether said output signal is lower (−) or higher (+) in frequency than said input signal; and
   summing means (203, 204, 201) responsive to a receipt of said first signal for generating a cumulative sum specifying said magnitude of said actual frequency difference.

3. The precision controlled frequency synthesizer of claim 2 wherein said summing means (203, 204, 201) comprises:
   an oscillator (203) for generating pulses of a preset frequency;

a counter (204) responsive to the receipt of said generated pulses for incrementing upon the receipt of each of said generated pulses;

means responsive to the receipt of said first signal for generating a calculate signal;

dividing means (201) responsive to the receipt of said calculate signal for dividing said preset frequency by a current count of said counter to determine said actual frequency difference between said input and said output signal;

means (221) for applying a reset signal to said counter following said division; and means (215) for applying a signal indicative of the result of said division to said computation means.

4. The precision controlled frequency synthesizer of claim 3 wherein said summing means (203, 204, 201) further comprises:

means (225) responsive to a finite number of said generated pulses for applying an overflow signal to said dividing means when said finite number occurs in said counter; and said dividing means being responsive to the receipt of said overflow signal for applying an alternate signal (217) to said computation means to generate said calculate signal.

5. The precision controlled frequency synthesizer of claims 2 or 3 wherein said referencing means (200) comprises:

selecting means being effective for producing a first desired signal specifying a desired frequency value indicative of said desired frequency difference; and said selecting means also being effective for producing a second desired signal associated with said first desired signal specifying by a + or − as to whether the frequency value is positive or negative.

6. The precision controlled frequency synthesizer of claim 2 wherein said computation means (209) comprises:

clock means (301, 302, 303) for generating a clock signal in response to the receipt of said first signal from said detecting means or said alternate signal from said dividing means;

latching means (305) responsive to the receipt of said actual value signal and said associated + or − indication for latching said actual frequency difference and associated + or − indication into a count latch register;

means (313, 314) controlled by said clock signal for applying said actual value signal and associated + or − indication to an arithmetic unit (306);

subtracting means in said arithmetic unit (306) responsive to a receipt by said arithmetic unit of said actual value signal and associated + or − indication and said desired value signal and associated + or − indication for producing a positive or negative difference signal representing the difference between said actual and desired values; and storing means (307) responsive to a receipt of said difference signal for registering said difference;

said storing means being additionally responsive to a delayed application of said clock signal to said storing means for producing said adjustment signal representative of said stored difference.

7. The precision controlled frequency synthesizer of claim 6 wherein said control means (206, 207, 208) comprises:

converting means (207) responsive to a receipt of said adjustment signal for generating an analog signal representation of said stored difference;

filtering means (206) responsive to a receipt of said analog signal for applying a stabilized signal to a voltage controlled oscillator; and means (208) responsive to a receipt of said stabilized signal to apply said output signal having a frequency change equivalent to said stored difference to said detecting means and to peripheral devices.

8. A method of operating a precision controlled frequency synthesizer for maintaining a desired frequency difference between an input and output signal, said method including the steps of:

generating an actual value signal representative of an actual frequency difference between said input and output signals;

generating a desired value signal representative of a desired frequency difference between said input and output signals;

producing an adjustment value signal in response to determining the difference between said actual frequency difference and said desired frequency difference; and changing the frequency of said output signal by the amount controlled by said adjustment value to maintain said desired frequency difference between said input and output signals.

9. The method of claim 8 wherein the step of generating said actual value signal representative of said actual frequency difference includes:

receiving simultaneously said input signal and said output signal;

comparing the relative phases and frequencies of said input and output signals to generate a first signal indicative of a magnitude of said actual frequency difference between said input and output signals;

comparing the relative phases and frequencies of said input and output signals to further generate a second signal associated with said first signal specifying whether said output signal is higher or lower in frequency than said input signal; and providing a cumulative sum in response to said first signal specifying numerically said magnitude of said actual frequency difference.

10. The method of claim 9 wherein the step of providing a cumulative sum includes:

generating pulses at a rate representative of a preset frequency value of an oscillator;

incrementing a counter in response to said generated pulses to produce a count with each occurrence of said generated pulse;

receiving said first signal to generate a calculate signal;

dividing said preset frequency value by a current count of said counter in response to said calculate signal to determine said cumulative sum representative of said magnitude of said actual frequency difference between said input and output signals;

generating a reset signal following said dividing step to reinitialize said counter; and applying said cumulative sum to a calculation device.

11. The method of claims 9 or 10 wherein the step of generating said desired value signal representative of said desired frequency difference includes:

setting an indicator to a frequency value;

producing a first desired signal specifying in response to said frequency value said desired frequency difference; and producing an associated second desired signal specifying whether said frequency value of said desired frequency difference is positive or negative.

12. The method of claim 11 wherein the step of producing an adjustment value signal includes:

receiving said first desired and said second desired signals indicative of said desired positive or negative frequency difference in a computation element;

receiving said first and said second signals indicative of said actual positive or negative frequency difference in said computation element;

subtracting said actual positive or negative frequency difference from said desired positive or negative frequency difference to determine a positive or negative difference; and producing said adjustment signal in response to said positive or negative difference.

13. The method of claim 12 wherein the step of changing the frequency of said output signal includes:

converting said adjustment signal into an analog signal;

stabilizing said analog signal to apply said stabilized signal to a voltage controlled oscillator; and applying in response to said stabilized signal said output signal having a frequency change equivalent to said positive or negative difference amount to a frequency and phase comparator and a peripheral device.

14. A method of operating a precision controlled frequency synthesizer for maintaining a desired proportional frequency relationship between an input and an output signal where said input signal changes in frequency, said method including the steps of:

receiving said input and output signals to generate an actual signal indicative of an actual frequency value having a positive or negative indication representative of an actual proportional frequency relationship between said input and output signals;

generating a desired signal indicative of a desired frequency value having a positive or negative indication representative of a desired proportional frequency relationship between said input and output signals;

subtracting said actual frequency value from said desired frequency value to produce an adjustment signal indicative of an adjustment frequency value having a positive or negative indication with each occurrence of when said input signal changes in frequency; and applying in response to said adjustment signal said adjustment frequency value to a voltage controlled oscillator to change said output signal by the amount of said adjustment frequency value to maintain said desired proportional frequency relationship between said input and output signals when said input signal changes in frequency.

15. The method of claim 14 wherein the step of subtracting includes:

receiving said actual signal of said actual frequency value having a positive or negative indication;

latching said actual frequency value having a positive or negative indication in a register to output same to an arithmetic unit;

receiving said desired signal of said desired frequency value having a positive or negative indication in said arithmetic unit;

performing arithmetic operations in response to the receipt of said actual signal of said actual frequency value and said desired signal of said desired frequency value to produce said adjustment signal indicative of a difference having a positive or negative indication representing said adjustment frequency value; and storing in response to said adjustment signal said difference of said adjustment frequency value in a register immediately following said arithmetic operations.

16. A method of operating a precision controlled frequency synthesizer for maintaining a desired proportional frequency relationship between an input and an output signal where an actual proportional frequency difference deviates from said desired proportional frequency difference said method including the steps of:

receiving said input and output signals to generate an actual signal indicative of an actual frequency value having a positive or negative indication representative of said actual proportional frequency relationship between said input and output signals;

generating a desired signal indicative of a desired frequency value having a positive or negative indication representing said desired proportional frequency relationship between said input and output signals;

subtracting said actual frequency value from said desired frequency value to produce an adjustment signal indicative of an adjustment frequency value having a positive or negative indication when said actual and desired values differ;

applying in response to said adjustment signal said adjustment frequency value to a voltage controlled oscillator; and shifting said output signal from said voltage controlled oscillator by the amount of said adjustment value to maintain said desired proportional frequency relationship between said input and output signals.

17. The method of claim 16 wherein the step of subtracting includes:

receiving said actual signal of said actual frequency value having a positive or negative indication;

latching said actual frequency value having a positive or negative indication in a register to output same to an arithmetic unit;

receiving said desired signal of said desired frequency value having a positive or negative indication in said arithmetic unit;

performing arithmetic operations in response to the receipt of said actual signal of said actual frequency value and said desired signal of said desired frequency value to produce said adjustment signal indicative of a difference having a positive or negative indication representing said adjustment frequency value; and storing in response to said adjustment signal said difference of said adjustment frequency value in a register immediately following said arithmetic operations.

* * * * *